US011151981B2

(12) United States Patent
Naylor-Teece et al.

(10) Patent No.: US 11,151,981 B2
(45) Date of Patent: Oct. 19, 2021

(54) AUDIO QUALITY OF SPEECH IN SOUND SYSTEMS

(71) Applicant: International Business Machines Corporation, Armonk, NY (US)

(72) Inventors: Alexander John Naylor-Teece, Newbury (GB); Andrew James Dunnings, Southampton (GB); Oliver Paul Masters, Birmingham (GB)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 16/598,621

(22) Filed: Oct. 10, 2019

(65) Prior Publication Data

US 2021/0110812 A1    Apr. 15, 2021

(51) Int. Cl.
*G10L 15/01* (2013.01)
*G10L 15/30* (2013.01)
*G10L 21/0364* (2013.01)

(52) U.S. Cl.
CPC .............. *G10L 15/01* (2013.01); *G10L 15/30* (2013.01); *G10L 21/0364* (2013.01)

(58) Field of Classification Search
CPC ................................ G10L 15/32; G10L 17/08
USPC ........................................................ 704/231
See application file for complete search history.

(56) References Cited

U.S. PATENT DOCUMENTS

| 5,315,689 | A | 5/1994 | Kanazawa |
| 6,499,013 | B1 | 12/2002 | Weber |
| 6,766,294 | B2 | 7/2004 | MacGinite |
| 6,879,956 | B1 * | 4/2005 | Honda ............... G10L 15/075 704/244 |
| 7,197,331 | B2 | 3/2007 | Anastasakos |

(Continued)

FOREIGN PATENT DOCUMENTS

| JP | 6531776 B2 * | 6/2019 | ............ G10L 15/22 |
| WO | 2017071453 A1 | 5/2017 | |

OTHER PUBLICATIONS

M. S. Hawley et al., "A Voice-Input Voice-Output Communication Aid for People With Severe Speech Impairment," in IEEE Transactions on Neural Systems and Rehabilitation Engineering, vol. 21, No. 1, pp. 23-31, Jan. 2013, doi: 10.1109/TNSRE.2012.2209678. (Year: 2013).*

(Continued)

*Primary Examiner* — Bharatkumar S Shah
(74) *Attorney, Agent, or Firm* — Edward P. Li

(57) ABSTRACT

A computer implemented method, apparatus, and computer program product for a sound system. Speech recognition is performed on input audio data comprising speech input to a sound system. Speech recognition is additionally performed on at least one instance of output audio data comprising speech reproduced by one or more audio speakers of the sound system. A difference between a result of speech recognition performed on the input audio data and a result of speech recognition performed on an instance of corresponding output audio data is determined. The quality of the reproduced speech is determined as unsatisfactory when the difference is greater than or equal to a threshold. A corrective action may be performed, to improve the quality of the speech reproduced by the sound system, if it is determined that the speech quality of the reproduced sound is unsatisfactory.

18 Claims, 4 Drawing Sheets

(56) References Cited

U.S. PATENT DOCUMENTS

| | | | |
|---|---|---|---|
| 7,228,275 B1* | 6/2007 | Endo | G10L 15/32 |
| | | | 704/231 |
| 8,559,655 B2 | 10/2013 | Mihelich | |
| 9,288,597 B2 | 3/2016 | Carlsson | |
| 10,154,346 B2 | 12/2018 | Raghavan | |
| 2004/0007129 A1 | 1/2004 | Sasano | |
| 2006/0147029 A1 | 7/2006 | Stokes, III | |
| 2007/0112563 A1 | 5/2007 | Krantz | |
| 2009/0081948 A1 | 3/2009 | Banks | |
| 2013/0304457 A1 | 11/2013 | Kang | |
| 2017/0287355 A1* | 10/2017 | Pogorelik | G09B 5/06 |
| 2019/0098407 A1 | 3/2019 | Faller | |
| 2020/0411007 A1* | 12/2020 | Boehme | G10L 15/32 |

OTHER PUBLICATIONS

M. S. Hawley et al., "A Voice-Input Voice-Output Communication Aid for People With Severe Speech Impairment," in IEEE Transactions on Neural Systems and Rehabilitation Engineering, vol. 21, No. 1, pp. 23-31, Jan. 2013, doi: 10.1109/TNSRE.2012.2209678. (Year: 2013) (Year: 2013).*

International Search Report and Written Opinion, International Application No. PCT/IB2020/059321, International Filing Date Oct. 5, 2020, 10 pages.

Naylor-Teece et al., "Improving Audio Quality of Speech in Sound Systems", International Application No. PCT/IB2020/059321, International Filing Date Oct. 5, 2020 27 pages.

"Speech recognition", Wikipedia, last edited on Sep. 25, 2019, 25 pages, <https://en.wikipedia.org/wiki/Speech_recognition>.

* cited by examiner

AUDIO QUALITY OF SPEECH IN SOUND SYSTEMS

BACKGROUND

The present invention relates generally to techniques for improving the quality of audio output from a sound system, and more particularly to for improving the quality of speech for listeners to the audio output of the sound system.

Sound systems are frequently used to play speech through audio speakers to listeners, such as attendees at conferences, lectures and performances at a theater or auditorium or participants in conference calls and webinars at distributed geographical locations over a communications network. In such systems, input speech to a microphone is received, and optionally recorded, at a host system, audio data is communicated by the host system to one or more audio speakers, and the audio speaker(s) output (i.e., "play") reproduced speech to the listeners. In many cases, the reproduced speech played through the audio speakers is not a perfect reproduction of the input speech (e.g., the speech may be unclear). For example, if the settings of an audio speaker are not optimized, the reproduced sound, and in consequence the reproduced speech, may be distorted, making it difficult for the listeners to hear and/or understand. In other cases, the input speech itself may be imperfect, for example, due to the position of the microphone relative to the source of the speech or sub optimal settings thereof. This again makes it difficult for listeners to hear or understand the speech being played by the audio speakers. Typically, such problems associated with the clarity of speech of the audio output can be resolved by adjustments to the sound system. For example, if listeners notify a host that the speech is difficult to hear or understand, the host can make adjustments to the configurable settings of the sound system or ask the human speaker to move relative to the microphone. However, this causes interruptions and delays whilst the adjustments are made. In addition, since the adjustments are manual, they may not fully resolve the difficulties for listeners.

SUMMARY

According to an aspect of the present invention, a computer implemented method is provided. The computer implemented method includes performing speech recognition on input audio data comprising speech input to a sound system. The computer implemented method further includes performing speech recognition on at least one instance of output audio data comprising reproduced speech by one or more audio speakers of the sound system. The computer implemented method further includes determining a difference between a result of the speech recognition on the input audio data and a result of the speech recognition on the at least one instance of the output audio data. The computer implemented method further includes determining that quality of the reproduced speech is unsatisfactory when the difference is greater than or equal to a threshold.

According to another aspect of the present invention, an apparatus is provided. The apparatus comprises a processor and data storage. The processor is configured to perform speech recognition on input audio data comprising speech input to a sound system. The processor is further configured to perform speech recognition on at least one instance of output audio data comprising reproduced speech by one or more audio speakers of the sound system. The processor is further configured to determine a difference between a result of the speech recognition on the input audio data and a result of the speech recognition on the at least one instance of the output audio data. The processor is further configured to determine that quality of the reproduced speech is unsatisfactory when the difference is greater than or equal to a threshold.

According to yet another aspect of the present invention, a computer program product is provided. The computer program product comprises a computer readable storage medium having program instructions embodied therewith. The program instructions are executable by a processor to cause the processor to: perform speech recognition on input audio data comprising speech input to a sound system; perform speech recognition on at least one instance of output audio data comprising reproduced speech by one or more audio speakers of the sound system; determine a difference between a result of the speech recognition on the input audio data and a result of the speech recognition on the at least one instance of the output audio data; and determine that quality of the reproduced speech is unsatisfactory when the difference is greater than or equal to a threshold.

BRIEF DESCRIPTION OF THE SEVERAL VIEWS OF THE DRAWINGS

Example implementations of the present disclosure will be described below with reference to the following drawings.

DETAILED DESCRIPTION

The present disclosure provides systems and methods for detecting when the quality of speech reproduced by a sound system is unsatisfactory (e.g., difficult to hear or unclear/incoherent for listeners), and for reconfiguring the sound system to improve the quality of the reproduced speech. The techniques of the present disclosure may be performed automatically, and in real time, so as to limit interruptions and improve the experience of listeners.

In particular, in accordance with the present disclosure, one or more microphones, distributed at positions within the listening environment, are used to detect reproduced speech played by one or more audio speakers of a sound system. Output audio data comprising the reproduced speech received by each of the one or more microphones is recorded. Speech recognition is performed on output audio data associated with each of the one or more microphones, to determine the quality of the speech being played at the corresponding microphone position. In addition, speech recognition is performed on input audio data comprising the speech input to the sound system, to determine the quality of the speech from the source. A comparison is performed between a result of the speech recognition performed on the input audio data and the result of the speech recognition performed on corresponding output audio data for each microphone. The result of the comparison is used to determine whether the speech quality is unsatisfactory for listeners, and, if so, to take correction action, such as making adjustments to the sound system to improve the quality of the reproduced speech.

In the present disclosure, the term "speech" is used to refer to sound or audio containing speech. The term "input audio data" refers to digital audio data for sound or audio containing speech originating from a source (e.g., a human speaker) detected by a microphone of the sound system (herein "input microphone"). The term "output audio data" refers to digital audio data for sound or audio containing speech reproduced by one or more audio speakers of a sound system and detected by a microphone of a sound system (herein "output microphone"). Audio data thus "represents" or "comprises" sound or audio containing speech that is received by a microphone of a sound system. References to "recording" of audio data refers to the storage of audio data in data storage, which includes the transient storage of audio data for communication over a network as well as temporary and long-term data storage of audio data as audio data files.

Figure 1:
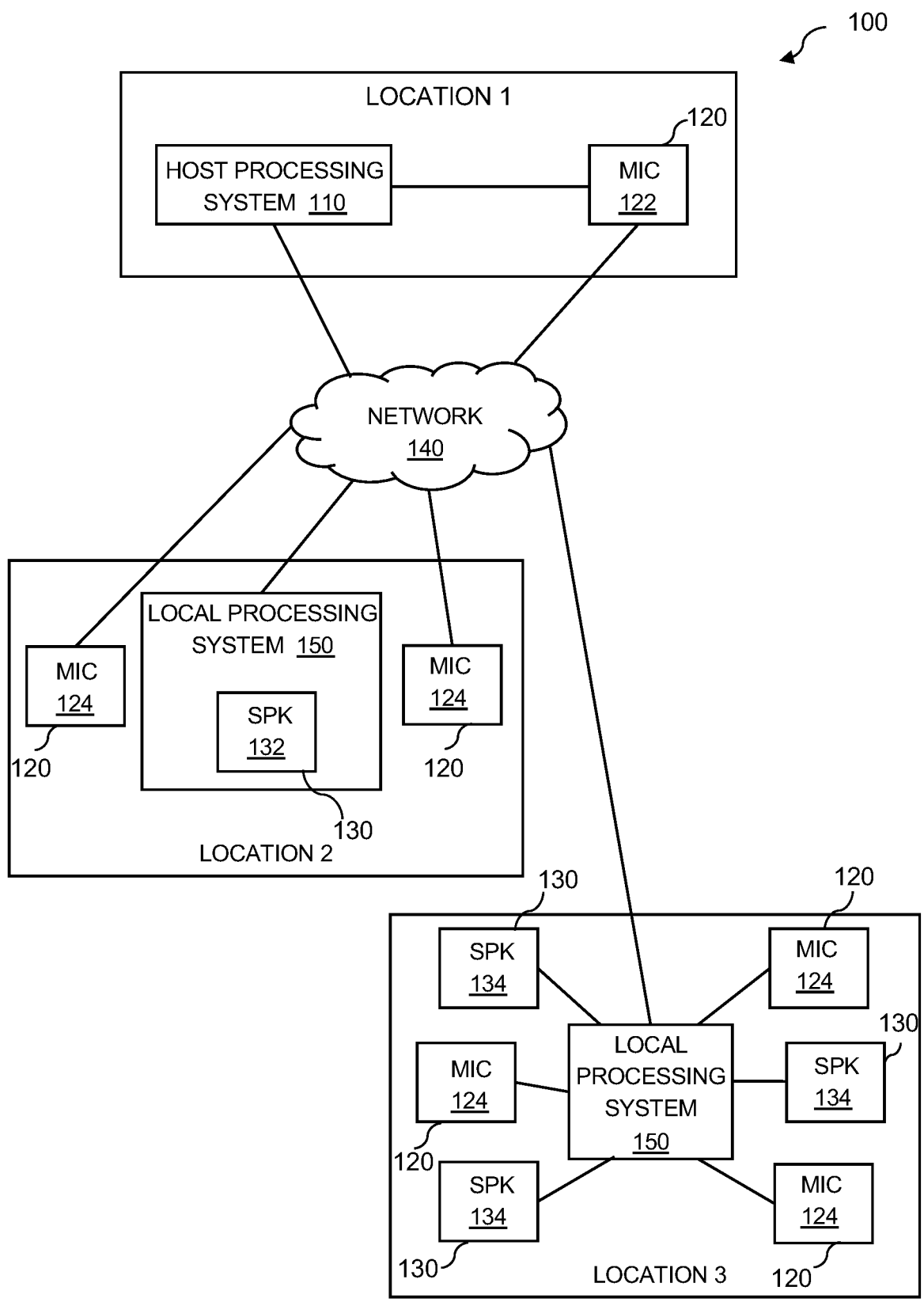
FIG. 1 is a schematic diagram showing a sound system, in accordance with one embodiment of the present invention.

FIG. 1 is a schematic diagram showing a sound system, in accordance with one embodiment of the present invention. Sound system 100 comprises a host processing system 110, a plurality of microphones 120, and a plurality of audio speakers 130 interconnected by a data communications network 140. In the system shown in FIG. 1, sound system 100 is a distributed system comprising microphones 120 and audio speakers 130 at different geographical locations (e.g., meeting or conference rooms). At least one location (location 1) comprises the host processing system 110 which, in the illustrated example, is the location of the source of the speech input to sound system 100. Other locations (locations 2 and 3) comprise audio speakers 130 for playing the audio to listeners in corresponding listening environments.

Host processing system 110 typically comprises a user computing system (e.g., notebook computer), a dedicated sound system controller or the like, which is operable by a user for managing the sound system 100. The plurality of microphones 120 comprise an input microphone 122 for detecting and recording speech from a source (e.g., human speaker) for reproduction by the sound system 100. Input microphone 122 may be a dedicated microphone for receiving input sound to the sound system 100 (e.g., a microphone on a lectern) or the like, or a microphone of a user computing system that may be "switched on" under the control of host processing system 110. The plurality of audio speakers 130 reproduce the input speech, and are distributed at different positions in one or more locations forming listening environments (locations 2 and 3). In particular, each audio speaker 130 receives and plays audio data corresponding to the recorded speech over network 140 from the host processing system 110. Audio speakers 130 may comprise one or more dedicated loudspeakers 134 of a sound system at the location (e.g., a speaker at a fixed location in a theater) or audio speakers 132 of user computing systems, networked telephones or the like. Communications network 140 may comprise any suitable wired or wireless network for communication of data between host processing system 110, microphones 120, and audio speakers 130.

In accordance with the present invention, the plurality of microphones 120 further comprises output microphones 124 located at positions within the listening environments (locations 2 and 3) for receiving and recording reproduced speech from the audio speakers 130 for analysis, as described herein. Output microphones 124 may comprise dedicated microphones of a sound system, for example associated with the audio speakers 134 at the location. Output microphones 124 may also comprise microphones of user computing systems or other devices present within the listening environments, which may be identified by the host processing system 110 and leveraged for the purpose. In the distributed system of FIG. 1, the output microphones 124 within one listening environment (location 3) are each associated with a local processing system 150, such as a system device, for recording the reproduced speech as output audio data for communication to host processing system 110 over network 140. The output microphones 124 within another listening environment (location 2) are configured for communication of audio data over network 140 to host processing system 110, which records the output audio data. As the skilled person will appreciate, the plurality of microphones 120 may comprise digital microphones that generate digital output signals and/or analog microphones that generate analog output signals that are received and converted to digital audio data by another component along the audio signal chain.

Host processing system 110 records speech received by input microphone 122 from the source as input audio data. In addition, host processing system 110 receives output audio data, corresponding to reproduced speech played by the audio speakers 130 recorded by each output microphone 124 and communicated over network 140. In accordance with the present invention, host processing system 110 is configured to perform speech recognition on input audio data associated with input microphone 122, and output audio data associated with each output microphone 124. Speech recognition techniques are known in the art and host processing system 110 may implement any suitable speech recognition technique. The speech recognition may result in a transcript of the speech and/or a value or level of a confidence measure or the like, indicating the reliability of the speech recognition. Speech recognition may be performed continuously or periodically on input audio data and the corresponding output audio data. Host processing system 110 further compares a result of speech recognition determined for output audio data associated with each output microphone 124 to a result of speech recognition determined for the corresponding input audio data associated with input microphone 122. If the comparison determines an unacceptable difference in the result determined for the output audio data of one or more of the output microphones 124 and the result determined for the input audio data of the input microphone 122, host processing system 110 determines that the speech quality of the reproduced speech is unsatisfactory for listeners, and takes corrective action. For example, corrective action may include adjusting parameters of components of the sound system (e.g., gain or channel equalization settings of a sound card controlling an audio speaker), or sending a message to a user to take certain action (e.g., instructions for a human speaker to move closer to or further away from the input microphone. For example, an unacceptable difference may be determined if a difference in the compared results derived from the speech recognition, such as a difference in confidence level or a measured difference in the speech transcript, is less than or equal to a threshold, as described further below.

Accordingly, host processing system 110 is able to detect when the quality of speech reproduced by the sound system 100 is unsatisfactory for listeners (i.e., unclear, distorted, or too quiet etc.) and to take action to improve the quality of the speech. Since the disclosed techniques can be performed automatically, and in real time, listener experience is improved. In the embodiment illustrated in FIG. 1, the techniques of the present invention are performed in the host processing system 110. As the skilled person will appreciate, the present invention may be implemented in any other processing device or system in communication with the sound system 100, such as a local processing system 150, or a combination of processing devices.

Figure 2:
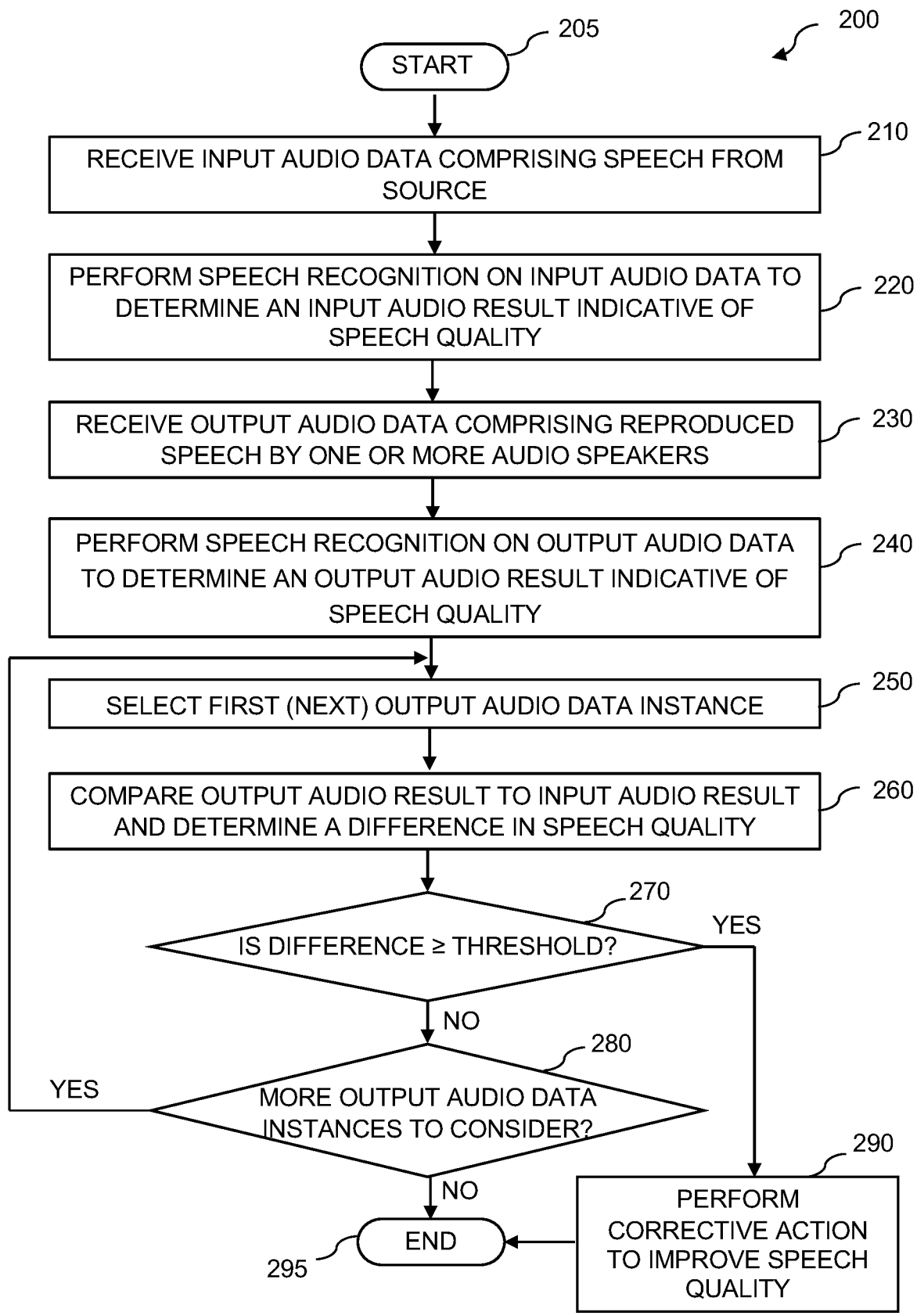
FIG. 2 is a flowchart of a method for detecting and correcting unsatisfactory speech quality, in accordance with one embodiment of the present invention.

FIG. 2 is a flowchart of a method 200 for detecting and correcting unsatisfactory speech quality, in accordance with one embodiment of the present invention. For example, the method 200 may be performed by the host processing system 110 of the sound system 100 of FIG. 1.

The method 200 starts at step 205. For example, step 205 may be initiated in response to the start of a sound check of the sound system, in response to the start of a talk, or otherwise.

At step 210, the sound system receives input audio data for speech input to the sound system from a source. For example, the input audio data may be received from the input microphone 122 of the sound system 100 of FIG. 1, in response to speech of a human speaker talking into the input microphone 122. The input audio data is typically received and recorded (e.g., stored in an input audio data file) substantially in real time (i.e., with minimal latency), for example, by host processing system 110 of FIG. 1.

At step 220, the sound system performs speech recognition on the input audio data to determine an input audio speech recognition result indicative of speech quality. Any suitable speech recognition technique or algorithm may be used to perform speech recognition. The result of speech recognition typically includes a transcript of the speech contained in the relevant audio data. The quality of the transcript may be indicative of the quality of the speech. In addition, the result of speech recognition may include a value or level of a confidence measure or the like, indicative of the reliability of the speech recognition. Such a confidence measure is known in the art of speech recognition. Thus, the confidence level may also indicate the quality of the speech. The speech recognition may provide other results that indicate the quality of the speech.

At step 230, the sound system receives output audio data for corresponding reproduced speech played by audio speakers of the sound system at one or more positions within listening environments. For example, an instance of output audio data may be received from each of one or more output microphones 124 detecting reproduced speech played by audio speakers 130 of the sound system 100 shown in FIG. 1. The output audio data is typically received substantially in real time, but is necessarily delayed relative to the input audio data. For example, latency arises from the communication of the input audio data to the audio speakers, and the communication of corresponding output audio data associated with the output microphones 124 over network 140 shown in FIG. 1. In some implementations, the output audio data is recorded, for example by local processing system 150 and/or host processing system 110 shown in FIG. 1.

At step 240, the sound system performs speech recognition on the output audio data to determine an output audio speech recognition result indicative of speech quality. In particular, at step 240, the sound system performs speech recognition on each received instance of output audio data. At step 240, the sound system utilizes the speech recognition technique used at step 220 so that the results at each of step 220 and step 240 are comparable.

Accordingly, at step 210 and step 220, the sound system derives speech recognition result(s) for the input audio data, and at step 230 and step 240, the sound system performs speech recognition result(s) for each instance of output audio. In each case, the speech recognition result includes a speech transcript and/or a confidence level or the like. As the skilled person will appreciate, in practice, step 210 to step 240 may be performed concurrently, in particular in applications in which the input and output audio data are received and processed continuously, such as in real-time.

In the example implementation of FIG. 2, multiple instances of output audio data are received. In particular, each instance of output audio data is associated with a specific output microphone positioned within a listening environment. At step 250, the sound system selects a speech recognition result for a first instance of output audio data.

At step 260, the sound system compares the selected speech recognition result for the instance of output audio data with the speech recognition result for the corresponding input audio data, and determines a difference in speech quality. The difference is a quantitative value representing the difference in speech quality that is calculated using the speech recognition result(s). In one implementation, at step 260, the sound system may compare the text of a transcript of the speech recognition determined for the instance of the output audio data with the text of a transcript of the corresponding input audio data, and may determine a difference such a raw numerical difference or percentage difference in the transcribed text (e.g., words). Differences in the text of the transcribed speech indicates that the speech quality at the audio speakers is reduced compared to the speech quality at the source, and the amount of the difference indicates the amount of deterioration in quality. In another implementation, at step 260, the sound system may compare a confidence level of the speech recognition determined for the instance of output audio data with the confidence level determined for the corresponding input audio data, and may determine a difference. As described above, the confidence level indicates the reliability of the transcribed speech (e.g., a value of a confidence measure expressed as a percentage). Since the reliability of the transcribed speech is dependent on the quality of the reproduced speech to listeners, a difference in confidence level indicates that the quality of the reproduced speech at the audio speakers is reduced compared to the quality of the speech at the source, and the amount of the difference indicates the amount of deterioration in quality. In other implementations, the sound system may compare other measures derived from the speech recognition result(s) for detecting a reduction in speech quality. As the skilled person will appreciate, at step 260, the sound system may compare a speech recognition result for a sample of output audio data with a speech recognition result for a corresponding sample of input audio data. In some scenarios, step 210 to step 240 may be performed continuously on input and reproduced speech (e.g., substantially in real time). In this case, corresponding samples of input audio data and output audio data, comprising the same input and reproduced speech, may be identified using any suitable technique, such as one or more of time synchronization and audio matching (identifying the same sections of audio in the audio data) or speech recognition transcript matching (identifying the same sections of text by matching words and phrases in the transcribed text). In other scenarios, step 210 to step 240 may be performed by periodically sampling input and reproduced speech (e.g., sampling input and reproduced speech over synchronized, temporally separate time windows), so that the speech recognition result(s) relate to corresponding samples of input audio data and output audio data.

At step 270, the sound system determines whether the difference is greater than or equal to a threshold. The threshold is a value of the difference measure (e.g., number/percentage or words in text or confidence measure) that represents an unacceptable reduction in speech quality of the reproduced speech compared with the quality of the input speech. The value of the threshold may be chosen according to application requirements, and may be changed by a user. For example, in some applications, a difference in speech quality up to 5% may be acceptable and so the threshold is set at 5%, whilst in other applications, a difference in speech quality up to 10% may be acceptable and so the threshold is set at 10%. In some example implementations, the value of the threshold may be adjusted based on the quality of the input speech, as described below.

If the difference is less than the threshold (NO branch of step 270), the quality of the reproduced speech in the selected instance of output audio data is satisfactory, and the sound system executes step 280. At step 280, the sound system determines whether there are more instances of output audio data to consider. If there are more instances of output audio data to consider (YES branch of step 280), the sound system starts to execute step 250, and then continues in a loop through step 260 and step 270, until the sound system at step 280 determines that there are no more instances of output audio data to consider. After determining that there are no more instances of output audio data to consider, the sound system ends execution at step 295.

If the difference is greater than or equal to the threshold (YES branch of step 270), the quality of the reproduced speech in the selected instance of output audio data is unsatisfactory, and the sound system executes step 290. At step 290, the sound system performs corrective action to improve the quality of the speech reproduced by the sound system. For example, the corrective action may involve changing configurable parameters of the sound system and/or sending messages to users, as described below with reference to FIG. 3.

As the skilled person will appreciate, many variations of the example implementation illustrated in FIG. 2 are possible. For example, speech recognition may be performed on output audio data associated with each output microphone at a corresponding local processing device or user device associated therewith. Thus, at step 240, the sound system may instead receive an output audio speech recognition result for output audio data associated with each output microphone over network 140, and step 230 may be omitted. Thus, the processing burden for speech recognition is distributed across multiple processing devices. In addition, prior to step 210, the sound system may identify available microphones at positions within the listening environments, and select a set of microphones for use as output audio microphones. For example, microphones of user devices may be identified based on an established connection to the network 140 from a listening environment or by global positioning system coordinates (or equivalent) within a listening environment. In this case, a message may be sent to the user seeking permission to use an identified microphone of the user device for listening to the reproduced speech, and the user can opt to allow or deny permission. If permission is allowed, the sound system may then switch on the microphone and any other features necessary to cause the user device to send the output audio data at step 230. In another example, standalone microphones connected to the network in the listening environment may be identified and used to send output audio data (e.g., if configured permissions of the microphone(s) allow). Furthermore, the sound system performs corrective action, in response to determining at step 270 that the quality of the reproduced speech in a single selected instance of output audio data is unsatisfactory. In other implementations, corrective action may be performed based on other criteria. For example, the sound system performs corrective action, in response to determining that the quality of the reproduced speech for multiple instances of output audio data is unsatisfactory. In another example, corrective action may be performed based on the position of the output microphone(s) within the listening environment, associated with the reproduced speech that is unsatisfactory.

Figure 3:
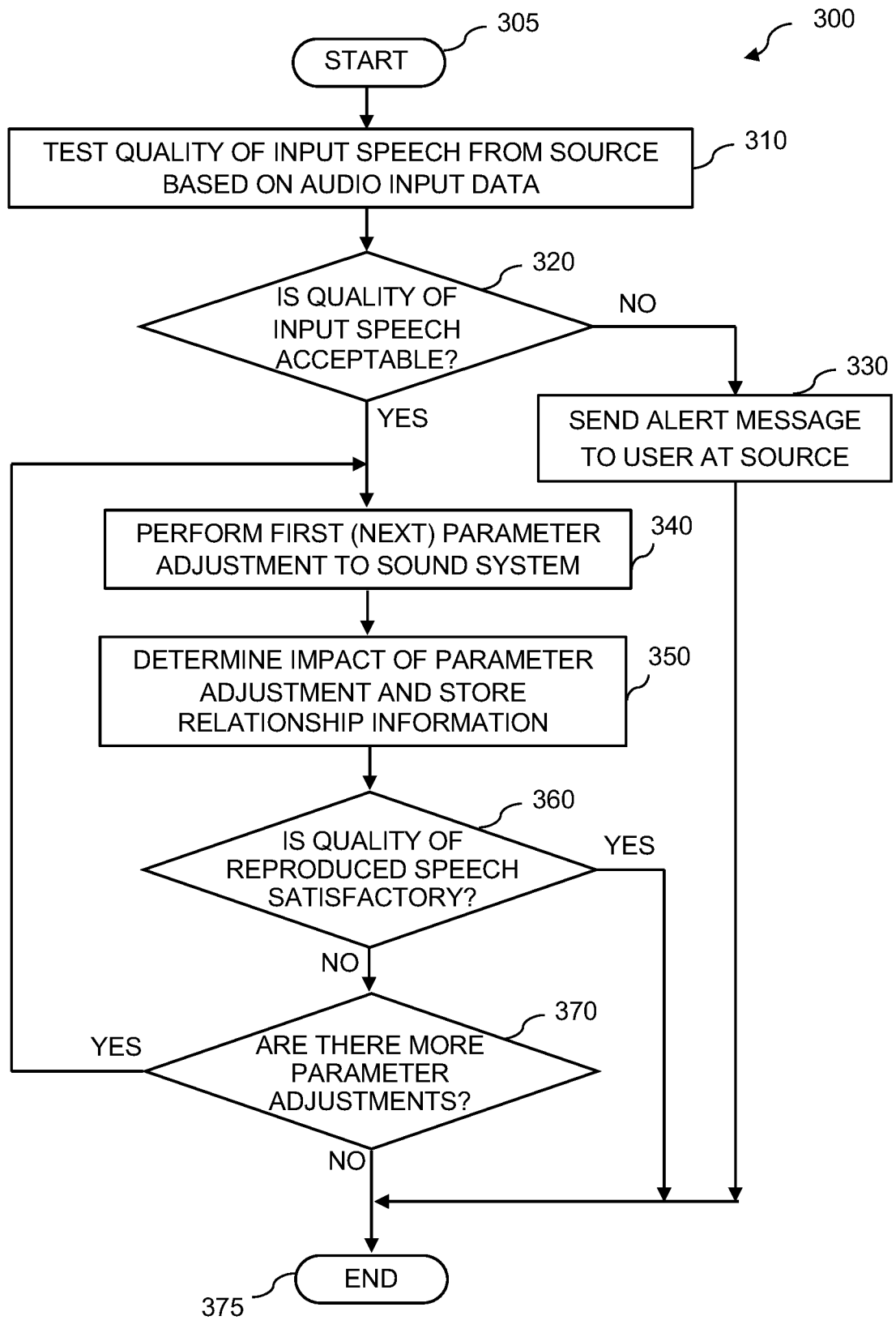
FIG. 3 is a flowchart of a method for adjusting a sound system to improve speech quality, in accordance with one embodiment of the present invention.

FIG. 3 is a flowchart of a method 300 for adjusting a sound system to improve speech quality, in accordance with one embodiment of the present invention. For example, the method 300 may be performed as the corrective action at step 290 shown in FIG. 2. The method 300 may be performed by the host processing system 110 of the sound system 100 shown in FIG. 1, or by another processing device of the sound system.

The method 300 starts at step 305. For example, the method 300 may start in response to determining that a difference between speech recognition result(s) of output audio data and input audio data is greater than or equal to a threshold. The difference being greater than or equal to a threshold indicates that the quality of the reproduced speech is unsatisfactory.

At step 310, the sound system tests the speech quality of the input speech from the source. For example, at step 310, the sound system may compare a result of the speech recognition with a threshold for speech quality. The threshold may be a predefined confidence level (e.g., 60%). The threshold may be configured by a user. Below the threshold indicates that the quality of input speech is unacceptable. In other examples, at step 310, the sound system may process the input audio data using one or more techniques that identify issues that adversely impact the quality of input speech, such as high volume of background noise relative to the input speech (indicated by low signal to noise ratio), the human speaker's proximity to the input microphone (indicated by "popping" effects), the settings (e.g., audio sensitivity or gain/volume levels) of the input microphone and the like. Thus, at step 310, the sound system may perform a series of tests to identify potential problems associated with the audio input.

At step 320, the sound system determines whether the quality of the input speech from the source is acceptable. For example, at step 320, the sound system may determine whether the sound system at step 310 has identified a problem with the input speech which indicates that the speech quality is unacceptable. In response to determining that the quality of the input speech is acceptable (YES branch of step 320), the sound system continues with step 340. However, in response to determining that the quality of the input speech is unacceptable (NO branch of step 204), the sound system proceeds to step 330.

At step 330, the sound system sends an alert message to a user at the source. In particular, the alert message to the user may include instructions to make adjustments based on the outcome of the test(s) at step 310. For example, if the result of the speech recognition performed on the input audio data is below the threshold, the alert message may instruct the human speaker to talk more clearly. In another example, if a test identifies a problem with the human speaker's proximity to the input microphone, the message may contain instructions to move closer to or further away from the input microphone. In yet another example, if a test identifies a problem with the input microphone, the alert message may contain instructions to adjust the microphone settings (e.g., audio sensitivity or gain/volume level). In other implementations, in scenarios where the sound system at step 310 identifies a problem with the input microphone, automatic adjustment of the input microphone may be performed, for example using step 340 to step 370 described below.

At step 340, the sound system makes a first parameter adjustment. The parameter adjusted may comprise any independently configurable parameter or setting of an individual component of the sound system, such as a sound card, audio speaker or microphone. Suitable parameters may include gain and equalization settings and the like for an audio component. As the skilled person will understand, equalization settings include adjustable settings for a plurality of frequency ranges (also called frequency bands or channels) of the audio signals. Thus, in terms of equalization, each adjustable frequency band of a component corresponds to an adjustable parameter. Accordingly, the adjustable parameters of a sound system comprise configurable settings, such as gain and equalization settings, per configurable component of the sound system. The parameter adjustment may comprise a positive or negative increment of the value of the parameter of a particular audio component such as an audio speaker. The parameter adjustment may be defined as an increment to an existing value of the parameter or a new (target) value for the parameter of the component. At step 340, the sound system may select the first parameter adjustment arbitrarily. Alternatively, the sound system may select the first parameter adjustment using an intelligent selection scheme, which may be predefined or learned, as described below. Accordingly, at step 340, the sound system may comprise sending configuration instructions to a remote component of the sound system (e.g., sound card of an audio speaker) to adjust an identified parameter of a component of the sound system by a defined amount or increment. In some implementations, the sound system at step 340 may comprise sending configuration instructions to adjust an identified parameter to a target value.

At step 350, the sound system determines the impact of the first parameter adjustment at step 340, and stores information concerning the determined relationship. In particular, at step 350, the sound system may perform an iteration of from step 210 to step 260 of the method 200 shown in FIG. 2, following the first parameter adjustment, and determine the impact of the adjustment. For example, the system at step 350 may determine the impact of the adjustment by comparing the difference in speech quality of the reproduced speech and the input speech determined at step 260 in the iteration of from step 210 to step 260 of the method 200 shown in FIG. 2, before and after the parameter adjustment. At step 350, the sound system may determine a positive or negative impact on quality of the reproduced speech arising from the first parameter adjustment (e.g., a percentage improvement or deterioration in speech quality). The sound system may store the parameter and increment corresponding to the parameter adjustment and the determined impact on speech quality, which together provide information about the relationship between the first parameter and the quality of reproduced speech for the sound system.

At step 360, the sound system determines whether the quality of the reproduced speech is satisfactory, following the first parameter adjustment at step 340. For example, the sound system may correspond to step 270 of the method 200 of shown in FIG. 2. In some implementations, the value of the threshold used at step 360 to determine whether the quality of reproduced speech is satisfactory may be adjusted based on the quality of the input speech. For example, the confidence level (or equivalent) of the speech recognition result for the reproduced speech is necessarily less than that of the input speech. Thus, the threshold confidence level (or equivalent) may be adjusted or determined based on the quality of the reproduced speech. For example, the threshold may be a function of the value of the confidence level (or equivalent) for the input speech, such as a fixed or variable percentage thereof (e.g., 90% to 95%). In response to determining that the quality of the reproduced speech is satisfactory (YES branch of step 360), the method ends at step 375. However, in response to determining that the quality of the reproduced speech is still unsatisfactory (NO branch of step 360) the method continues with step 370.

At step 370, the sound system determines whether there are more configurable parameter adjustments to be made. In particular, in some implementations, the sound system may cycle just once through a predetermined set of parameter adjustments, as part of the corrective action of step 290 of the method 200 shown in FIG. 2. In response to determining that there are more parameter adjustments that can be made (YES branch of step 370), the method returns to step 340, which makes a next parameter adjustment. The sound system continues in a loop from step 350 to step 370 until the sound system determines that there are no more parameter adjustments to be made. In response to determining that there are no more parameter adjustments to be made (NO branch of step 370), the method ends at step 375. In other implementations, the sound system may repeat cycles through a set of parameter adjustments of the sound system until a predefined condition is met. For example, the condition may be that the quality of the reproduced speech is satisfactory, that there is no significant improvement in the quality of reproduced speech by successive parameter adjustments (i.e., the quality of speech is maximized) or a timer expires. In this case, step 370 may be omitted, the sound system at step 360 determines whether one or more of the conditions is met and, if not, the method 300 returns to step 340, which makes the next parameter adjustment. The method 300 then continues in a loop from step 350 to step 360 until the sound system determines that the quality of audio output is satisfactory (or another condition is met), and the method ends at step 375.

Accordingly, with method 300, the sound system improves the quality of reproduced speech, when the input speech has acceptable quality by automatically adjusting the configuration of the sound system. In particular, the sound system automatically adjusts configurable parameters of the sound system to improve the quality of the reproduced speech.

In addition, the sound system determines and stores information about the relationships between one or more configurable parameters of components of the sound system and speech quality. Over time, this information may be used for more intelligent adjustment of the configurable parameters of the sound system. For example, the information may be used to predict the particular adjustment(s) required for a particular parameter or group of parameters to provide a minimal expected difference between input and reproduced speech quality, in response to detection of unsatisfactory speech quality at one or more particular positions in the listening environments.

As the skilled person will appreciate, there may be an interdependency between the configurable parameters of the sound system in relation to their impact or effect on speech quality. For example, say a first parameter adjustment comprising a positive increment of a first parameter leads to improved but unsatisfactory speech quality, a second parameter adjustment comprising a positive increment of a second parameter leads to reduced speech quality, but a subsequent third parameter adjustment comprising a negative increment of the first parameter—to below its original level—leads to satisfactory speech quality. In this example, the first and second parameters are interdependent—a negative adjustment of the first parameter should be in combination with the positive adjustment of the second parameter in order to improve speech quality. Such patterns of interdependency between configurable parameters of the sound system and speech quality may be determined from the stored information, gathered over a time period, and used to develop intelligent schemes for parameter adjustment of the sound system from step 340 to step 370.

In some implementations, intelligent schemes for the adjustment of the sound system may be developed using machine learning. In particular, information stored at step 350, in response to one or a series of incremental parameter adjustments, may be stored in a centralized database for one or more sound systems, and used as training data for a machine learning model. This training data may additionally include information about the input audio data (e.g., input microphone type/quality, gain/amplitude/volume, background noise etc.) and/or information about the input speech (e.g., pitch, language, accent etc.) as well as information about the type and arrangement of the relevant sound system. In this way, a machine learning model may be developed to accurately predict the best configuration for a particular sound system for a particular type of input speech (e.g., a particular category of human speaker). The model may then be used to intelligently and/or concurrently adjust multiple configurable parameters (e.g., relating to the same and/or different audio components) of the sound system for optimized output speech quality. Concurrent parameter adjustments to achieve a predicted best configuration may reduce or eliminate the need for multiple incremental parameter adjustments and iterations from step 340 to step 370. Following development of the model, information recorded at step 350 may be used as feedback to improve model performance.

Figure 4:
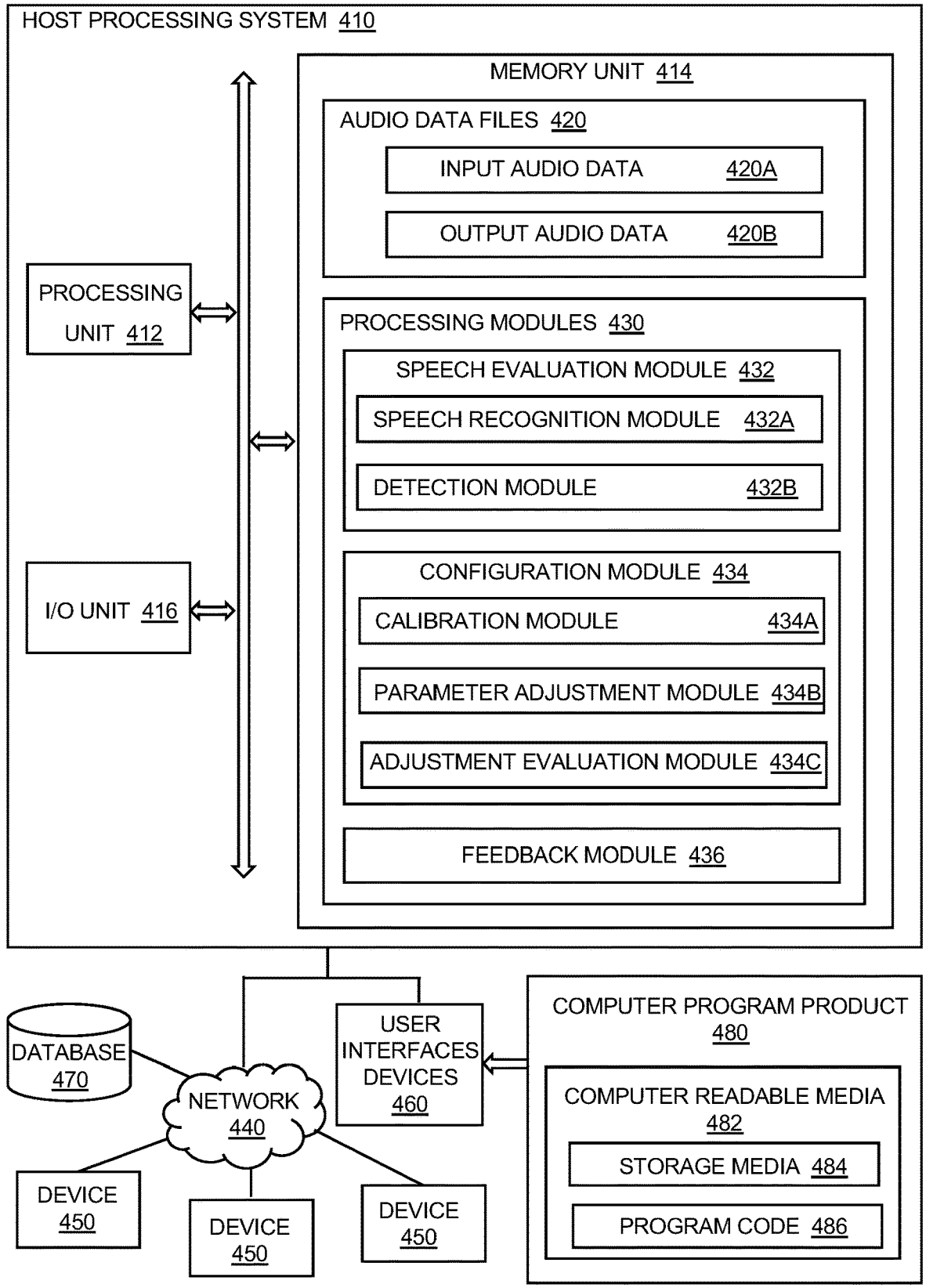
FIG. 4 is a block diagram of a sound system, in accordance with one embodiment of the present invention.

FIG. 4 is a block diagram of a system 400, in accordance with one embodiment of the present invention. In particular, system 400 comprises processing components for a sound system, as described herein.

System 400 includes a host processing system 410, database 470 and processing devices 450 (e.g., local processing devices and user devices) at listening locations in communication with host processing system 410 over a network 440. Network 440 may comprise any suitable wired or wireless data communications network, such as a mobile communications network, local area network (LAN), wide area network (WAN) or the Internet. Host processing system 410 comprises processing unit 412, memory unit 414 and input/output (I/O) unit 416. Host processing system 410 may include user interface devices 460 connected to I/O unit 416. User interface devices 460 may include one or more of a display (e.g., screen or touchscreen), a printer, a keyboard, a pointing device (e.g., mouse, joystick, touchpad), an audio device (e.g. microphone and/or speaker) and any other type of user interface device.

Memory unit 414 comprises audio data files 420, and one or more processing modules 430 for performing methods in accordance with the present disclosure. Audio data files 420 include input audio data 420A associated with an input microphone of the sound system. In addition, audio data files 420 include output audio data 420B associated with output microphones at distributed positions within listening environments, received via I/O unit 416 over network 440. Each processing module 430 comprises instructions for execution by processing unit 412 for processing data and/or instructions received from I/O unit 416 and/or stored in memory unit 414 such as audio data files 420.

In accordance with example implementations of the present disclosure, processing modules 430 include a speech evaluation module 432, a configuration module 434 and a feedback module 436.

Speech evaluation module 432 is configured to evaluate the quality of reproduced speech in output audio data 420A, corresponding to the audio data played by audio speakers of the sound system. In particular, speech evaluation module 432 comprises a speech recognition module 432A and a detection module 432B. Speech recognition module 432A is configured for performing speech recognition on input audio data 420A and output audio data 420B from audio data files 420, for example as at step 220 and step 240 of the method 200 shown in FIG. 2. Detection module 432B is configured for detecting when the quality of reproduced speech in output audio data 420B is unsatisfactory for listeners, for example as from step 250 to step 270 of the method 200 shown in FIG. 2. Accordingly, speech evaluation module 432 retrieves and processes audio data files 420 to perform the method 200 shown in FIG. 2. Notably, processing by speech evaluation module 432 may be performed in real time, using input audio data 420A and output audio data 420B as it is received from the sound system, as described herein.

Configuration module 434 is configured to adjust configurable parameters of the sound system to optimize the quality of reproduced speech. Configuration module 434 includes a calibration module 434A, a parameter adjustment module 434B and an adjustment evaluation module 434C. Calibration module 434A is configured to calibrate the sound system, for example at setup time and subsequently when required. In particular, calibration module 434A may calibrate the sound system in conjunction with speech evaluation module 432 using a pre-recorded input audio data file 420A comprising speech that is considered to be "perfect" for the purposes of speech recognition. If detection module 432B detects that the quality of reproduced speech is unsatisfactory for listeners, parameter adjustments are made and evaluated using parameter adjustment module 434B and adjustment evaluation module 434C, as described below, until the quality of reproduced speech is maximized. As the skilled person will appreciate, calibration of the sound system using a "perfect" speech sample determines the difference in the determined quality of reproduced speech compared to input speech that can be achieved with the sound system in a best-case scenario. This may be used to set the initial threshold for satisfactory reproduced speech quality used at step 270 of the method 200 shown in FIG. 2, for example. As described above, the threshold may be adjusted during use based on the quality of the actual input speech. Parameter adjustment module 434B is configured to adjust configurable parameters of the sound system. For example, parameter adjustment module 434B may iteratively make parameter adjustments using an arbitrary or intelligent scheme, for example as at step 340 of the method 300 shown in FIG. 3. Adjustment evaluation module 434C is configured to evaluate the impact of a parameter adjustment performed by parameter adjustment module 434B. In particular, adjustment evaluation module 434C is configured to determine whether the quality of reproduced speech is satisfactory after a parameter adjustment, as from step 350 and step 360 of the method 300 shown in FIG. 3. As described above, parameter adjustment module 434B and adjustment evaluation module 434C may be invoked by calibration module 434A and detection module 432B to respectively configure and reconfigure parameters of the sound system to optimize the quality of reproduced speech.

Feedback module 436 is configured to provide information obtained from the operation of speech evaluation module 432 and/or configuration module 434 as feedback. For example, feedback module 436 may provide feedback (e.g., an alert message) to a human speaker indicating that the quality of the input speech, as determined by speech recognition module 432A or other analysis of the input audio data, is unacceptable, for example as at step 310 and step 320 of the method 300 shown in FIG. 3. In addition, or alternatively, feedback module 436 may provide information about the impact of parameter adjustments on the quality of reproduced speech to a system or model for developing or improving an intelligent parameter adjustment scheme to optimize performance, for use at step 340 of the method 300 shown in FIG. 3. For example, feedback module 436 may send feedback comprising information concerning relationships between sound system parameters and speech quality, stored at step 350 of the method 300 shown in FIG. 3, to a centralized database 470 over network 440 or to another data storage. The stored data may be used as training data for a machine learning model for optimizing sound system performance, or as feedback for refining an existing machine learning model. Furthermore, feedback module 436 may provide feedback to a user of host processing system 410 in the event that the configuration module 434 is unable to optimize parameters of the sound system to provide reproduced speech having satisfactory speech quality. For example, an alert message may be sent, when the sound system, at step 280 of the method 200 shown in FIG. 2, determines that there are no more output audio data instances to consider, before the method 200 ends at step 295. This alert message may provide recommendations to the owner of the sound system, such as recommended actions to improve performance of the sound system. For example, the alert message may instruct the owner to perform manual checks of the sound system components (e.g., sound cards), to change the number or location of the components and/or to change the overall power of the sound system. Techniques for making recommendations for manual checks and changes to sound systems are known in the art, and any suitable technique may be used, whether now known or developed in the future.

Referring to FIG. 4, a computer program product 480 is provided. The computer program product 480 includes computer readable media 482 having storage media 484 and program instructions 486 (i.e., program code) embodied therewith. The program instructions 486 are configured to be loaded onto memory unit 414 of host processing system 410 via I/O unit 416, for example by one of user interface devices 460 or other devices 450 connected to network 440. In example implementations, program instructions 486 are configured to perform steps of one of more of the methods disclosed herein, such as steps of the method shown in FIG. 2 or FIG. 3, as described above.

Whilst the present disclosure has been described and illustrated with reference to example implementations, the skilled person will appreciate that the present disclosure lends itself to many different variations and modifications not specifically illustrated herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device, such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network (LAN), a wide area network (WAN), and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++, and conventional procedural programming languages, such as the C programming language, or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture, including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various example implementations of the present disclosure have been presented for purposes of illustration, but are not intended to be exhaustive or limited to the implementations disclosed. Many modifications and variations will be apparent to those of ordinary skill in the art without departing from the scope and spirit of the described implementations. The terminology used herein was chosen to best explain the principles of the example implementations, the practical application or technical improvement over technologies found in the marketplace, or to enable others of ordinary skill in the art to understand the implementations disclosed herein.

What is claimed is:

1. A computer implemented method comprising:
    performing speech recognition on input audio data comprising speech input to a sound system;
    performing speech recognition on at least one instance of output audio data comprising reproduced speech by one or more audio speakers of the sound system;
    determining a difference between a result of the speech recognition on the input audio data and a result of the speech recognition on the at least one instance of the output audio data;
    determining that quality of the reproduced speech is unsatisfactory when the difference is greater than or equal to a threshold; and
    wherein parameters in one or more parameter adjustments are selected from a group consisting of: audio gain and audio channel equalization for each frequency band of a component of the sound system.

2. The computer implemented method of claim 1, wherein the difference comprises a quantitative value calculated from the result of the speech recognition on the input audio data for a sample of input speech and the result of the speech recognition on the output audio data for a sample of the reproduced speech corresponding to the sample of the input speech.

3. The computer implemented method of claim 1, wherein determining the difference between the result of the speech recognition on the input audio data and a result of the speech recognition on the at least one instance of the output audio data comprises:
    comparing text of a transcript of the speech recognition on the input audio data with text of a transcript of the speech recognition on the at least one instance of the output audio data; and
    determining a quantitative value for the difference selected from a group consisting of: number of characters that are different, number of words that are different, and percentage of characters or words that are different.

4. The computer implemented method of claim 1, wherein determining the difference between the result of the speech recognition on the input audio data and a result of the speech recognition on the at least one instance of the output audio data comprises:
    comparing a first confidence level determined by the speech recognition on the input audio data with a second confidence level determined by the speech recognition on the at least one instance of the output audio data, the first confidence level comprising a value of a confidence measure indicating reliability of the speech recognition on the input audio data, the second confidence level comprising a value of a confidence measure indicating reliability of the speech recognition the at least one instance of the output audio data; and
    determining a difference between the first confidence level and the second confidence level.

5. The computer implemented method of claim 1, further comprising:
    performing the one or more parameter adjustments of the sound system to improve the quality of the reproduced speech, in response to determining that the quality of the reproduced speech is unsatisfactory.

6. The computer implemented method of claim 5, wherein performing the one or more parameter adjustments of the sound system comprises:

performing a first parameter adjustment comprising adjusting a parameter of the sound system by a defined increment or to a target value; and in response to determining that the quality of the reproduced speech is still unsatisfactory, performing a further parameter adjustment until a predefined condition is met.

7. The computer implemented method of claim 6, wherein the predefined condition is selected from a group consisting of: the quality of the reproduced speech is satisfactory, the quality of the reproduced speech is maximized, a predefined set of parameter adjustments have been performed, the predefined set of parameter adjustments have been performed in accordance with an intelligent parameter adjustment scheme, the predefined set of parameter adjustments have been adjusted according to an optimization model, and a timer expires.

8. The computer implemented method of claim 5, further comprising:

determining an impact of a parameter adjustment on the quality of the reproduced speech based on the difference between the result of the speech recognition on the input audio data and the result of the speech recognition on the at least one instance of the output audio data, the input audio data and the output audio data comprising input speech and the reproduced speech after the parameter adjustment, and storing relationship information comprising a parameter and increment corresponding to the parameter adjustment and the impact on the quality of the reproduced speech, for use as feedback to an intelligent parameter adjustment selection scheme or a machine learning model for optimizing the quality of the reproduced speech.

9. The computer implemented method of claim 1, further comprising:

determining whether quality of an speech input to the sound system is acceptable, and in response to determining that the quality of the speech input to the sound system is not acceptable, sending a message to a user to make changes relating to the speech input to the sound system.

10. An apparatus comprising:

a processor and data storage, wherein the processor is configured to:

perform speech recognition on input audio data comprising speech input to a sound system;

perform speech recognition on at least one instance of output audio data comprising reproduced speech by one or more audio speakers of the sound system;

determine a difference between a result of the speech recognition on the input audio data and a result of the speech recognition on the at least one instance of the output audio data;

determine that quality of the reproduced speech is unsatisfactory when the difference is greater than or equal to a threshold; and wherein parameters in one or more parameter adjustments are selected from a group consisting of: audio gain, and audio channel equalization for each frequency band of a component of the sound system.

11. The apparatus of claim 10, wherein the difference comprises a quantitative value calculated from the result of the speech recognition on the input audio data for a sample of input speech and the result of the speech recognition on the output audio data for a sample of the reproduced speech corresponding to the sample of the input speech.

12. The apparatus of claim 10, wherein the processor is configured to determine the difference between the result of the speech recognition on the input audio data and the result of the speech recognition on the at least one instance of the output audio data by:

comparing text of a transcript of the speech recognition on the input audio data with text of a transcript of the speech recognition on the at least one instance of the output audio data; and determining a quantitative value for the difference selected from a group consisting of: number of characters that are different, number of words that are different, and percentage of characters or words that are different.

13. The apparatus of claim 12, wherein the processor is configured to perform the one or more parameter adjustments of the sound system by:

performing a first parameter adjustment comprising adjusting a parameter of the sound system by a defined increment or to a target value; and in response to determining that the quality of the reproduced speech is still unsatisfactory, performing a further parameter adjustment until a predefined condition is met.

14. The apparatus of claim 13, wherein the predefined condition is selected from a group consisting of: the quality of the reproduced speech is satisfactory, the quality of the reproduced speech is maximized, a predefined set of parameter adjustments have been performed, the predefined set of parameter adjustments have been performed in accordance with an intelligent parameter adjustment scheme, the predefined set of parameter adjustments have been adjusted according to an optimization model, and a timer expires.

15. The apparatus of claim 10, wherein the processor is configured to determine the difference between the result of the speech recognition on the input audio data and the result of the speech recognition on the at least one instance of the output audio data by:

comparing a first confidence level determined by the speech recognition on the input audio data with a second confidence level determined by the speech recognition on the at least one instance of the output audio data, the first confidence level comprising a value of a confidence measure indicating reliability of the speech recognition on the input audio data, the second confidence level comprising a value of a confidence measure indicating reliability of the speech recognition the at least one instance of the output audio data; and determining a difference between the first confidence level and the second confidence level.

16. The apparatus of claim 10, wherein the processor is further configured to:

perform the one or more parameter adjustments of the sound system to improve the quality of the reproduced speech, in response to determining that the quality of the reproduced speech is unsatisfactory.

17. The apparatus of claim 10, wherein the processor is further configured to:

determine whether quality of an speech input to the sound system is acceptable, and in response to determining that the quality of the speech input to the sound system is not acceptable, send a message to a user to make changes relating to the speech input to the sound system.

18. A computer program product comprising a non-transitory computer readable storage medium having program instructions embodied therewith, wherein the program instructions are executable by a processor to cause the processor to:
- perform speech recognition on input audio data comprising speech input to a sound system;
- perform speech recognition on at least one instance of output audio data comprising reproduced speech by one or more audio speakers of the sound system;
- determine a difference between a result of the speech recognition on the input audio data and a result of the speech recognition on the at least one instance of the output audio data;
- determine that quality of the reproduced speech is unsatisfactory when the difference is greater than or equal to a threshold; and
- wherein parameters in one or more parameter adjustments are selected from a group consisting of: audio gain, and audio channel equalization for each frequency band of a component of the sound system.

* * * * *